United States Patent [19]

Orihara et al.

[11] Patent Number: 5,705,852
[45] Date of Patent: Jan. 6, 1998

[54] NON-CONTACT IC CARD AND PROCESS FOR ITS PRODUCTION

[75] Inventors: Katsuhisa Orihara; Masahiro Fujimoto; Haruo Monkawa; Hideyuki Kurita, all of Kanuma, Japan

[73] Assignee: Sony Chemicals Corp., Tokyo, Japan

[21] Appl. No.: 629,565

[22] Filed: Apr. 9, 1996

[30] Foreign Application Priority Data

Apr. 13, 1995 [JP] Japan .................... 7-113641

[51] Int. Cl.$^6$ .................................... H01L 23/02
[52] U.S. Cl. .................... 257/679; 257/783; 257/780
[58] Field of Search ....................... 257/679, 778, 257/782, 783, 780; 437/215, 228, 229, 925

[56] References Cited

U.S. PATENT DOCUMENTS 5,448,110  9/1995  Tuttle et al. .
5,598,032  1/1997  Fidalgo .

*Primary Examiner*—Carl W. Whitehead
*Assistant Examiner*—S. V. Clark
*Attorney, Agent, or Firm*—Hill, Steadman & Simpson

[57] ABSTRACT

In a non-contact IC card comprising a substrate and provided thereon at least an IC chip and an antenna coil formed by etching, a connecting terminal of the antenna coil and a connecting bump of the IC chip are interconnected in a face-down fashion via an anisotropic conductive adhesive layer, or interconnected by wire bonding.

7 Claims, 7 Drawing Sheets

NON-CONTACT IC CARD AND PROCESS FOR ITS PRODUCTION

BACKGROUND OF THE INVENTION

1. Field of the Invention

This invention relates to a non-contact integrated circuit (hereinafter "IC") card for transferring information through an induction electromagnetic field serving as a transmission medium. More particularly, it relates to a non-contact IC card having the structure wherein an IC chip and an antenna coil formed by etching are interconnected without use of jumper wires.

2. Description of the Related Art

In recent years, in the fields of traffic, finance, distribution and so forth, data carrier systems making use of bar codes, magnetic cards, IC cards, optical cards and so forth have come into wide use. In particular, what has attracted notice as a data carrier system which transmits and receives signals at a relatively short distance and in a non-contact state is a system in which electromagnetic waves emitted from an interrogator (a reader/writer) cause a change of the magnetic field in the vicinity of an antenna coil provided in a transponder (a non-contact IC card), to produce an induced voltage in the antenna coil and the voltage thus produced is utilized as a power source.

Such a non-contact IC card has a basic circuit construction in which, as shown in FIG. 7, a rectifier diode Di, a smoothing capacitor 8 and an IC chip 6 are connected to a resonance circuit comprised of an antenna coil 2 and a tuning capacitor 7. The antenna coil 2 is used as a component part separated from the IC chip, while the tuning capacitor 7, the rectifier diode Di and the smoothing capacitor 8 may be provided within the area of the IC chip 6.

The non-contact IC card having the circuit construction as shown in FIG. 7 has a specific structure wherein at least the IC chip and the antenna coil are provided on a substrate, and a core material comprising urethane resin is provided on the side of the substrate where the IC chip has been provided, the substrate provided with these being further held between insulating films of polyethylene terephthalate or the like so as to be covered on its both sides.

As antenna coils conventionally used in such non-contact IC cards, those comprising a metallic thin wire is coiled into a ring on the same plane to form a sheet-like coil are chiefly used. In such a case, ends of the antenna coil on its inner peripheral side and outer peripheral side are each led out and connected to an IC chip connecting pad.

However, such a sheet-like antenna coil prepared using a wire has a lower limit in its wire diameter from the viewpoint of performances or strength, and has had the problem that, when it has a great number of turns, the coil may flatten after a coiled wire has been made up, making it impossible to provide sufficiently thin IC cards. It also requires assembly steps in a large number to a certain extent, and has had the problem that there is a limit in the improvement of yield to cause a restriction in reducing production cost. It still also has had a problem in respect of reliability.

Accordingly, in order to make non-contact IC cards smaller in thickness and to decrease production cost, it is attempted to produce the antenna coil not using metallic wires but by etching copper foil laminated on an insulating substrate. In this case, the IC chip and the antenna coil are interconnected in the manner as shown in FIG. 8.

More specifically, as shown in FIG. 8, an inner peripheral side terminal 2a and an outer peripheral side terminal 2b of an antenna coil 2, formed on an insulating substrate by etching, are connected to connecting pads 6c and 6d of the IC chip 6 fixedly provided inside the antenna coil 2 on the insulating substrate 1, which are respectively interconnected through jumper wires 4a and 4b.

When, however, the IC chip and the antenna coil are interconnected through the jumper wires, the jumper wires must be wired by complicated operation, causing the problem of an increase in production cost. Also, the antenna coil connecting terminals are relatively distant from the IC chip connecting pads and the jumper wires must not come into contact with an antenna coil inside an outer peripheral side terminal 2b, and hence the jumper wires rise from the substrate, bringing about the problem of an increase in the thickness of non-contact IC cards. Still also, bending stress is directly applied to the jumper wires, and there has been the problem that the joints may partly separate or cause disconnection.

SUMMARY OF THE INVENTION

The present invention will solve the problems involved in the prior art as discussed above. An object thereof is to enable connection between the IC chip and the etched antenna coil (the antenna coil formed by etching) of a non-contact IC card, without making the thickness of the non-contact IC card too large, and yet at a high reliability and a low production cost.

The present inventors have discovered that the above object can be achieved when the IC chip and etched antenna coil of a non-contact IC card are interconnected in a face-down fashion via an anisotropic conductive adhesive layer, or interconnected by wire bonding. They have thus accomplished the present invention.

More specifically, the present invention provides a non-contact IC card that transfers information through an induction electromagnetic field serving as a transmission medium;

the non-contact IC card comprising a substrate and provided thereon at least an IC chip and an antenna coil formed by etching; wherein a connecting terminal of the antenna coil and a connecting bump of the IC chip are interconnected in a face-down fashion via an anisotropic conductive adhesive layer.

The present invention also provides a non-contact IC card that transfers information through an induction electromagnetic field serving as a transmission medium;

the non-contact IC card comprising a substrate and provided thereon at least an IC chip and an antenna coil formed by etching; wherein a connecting terminal of the antenna coil and a connecting bump of the IC chip are interconnected by wire bonding.

The present invention still also provides a process for producing a non-contact IC card, comprising the steps of;

- forming a resist layer having at least an antenna coil pattern, on a conductive layer provided on an insulating substrate;
- etching the conductive layer, using the resist layer as a mask, to form at least an antenna coil and a connecting terminal thereof;
- forming an anisotropic conductive adhesive layer on the connecting terminal of the antenna coil; and
- interconnecting the connecting terminal of the antenna coil and a connecting bump of an IC chip in a face-down fashion via the anisotropic conductive adhesive layer.

DESCRIPTION OF THE PREFERRED EMBODIMENTS

In the non-contact IC card of the present invention, the connecting terminal of an antenna coil and the connecting bump of an IC chip are interconnected in a face-down fashion via an anisotropic conductive adhesive layer, or interconnected by wire bonding. Hence, the both can be interconnected without use of jumper wires. Moreover, when the anisotropic conductive adhesive is used, a high connection reliability can be achieved and also the connection can be operated with ease, also promising a low material cost. Thus, it is possible to interconnect the antenna coil and the IC chip without making the thickness of the IC card too large, and yet at a high connection reliability and a low production cost.

The present invention will be described in greater detail with reference to the accompanying drawings.

Figure 1A:
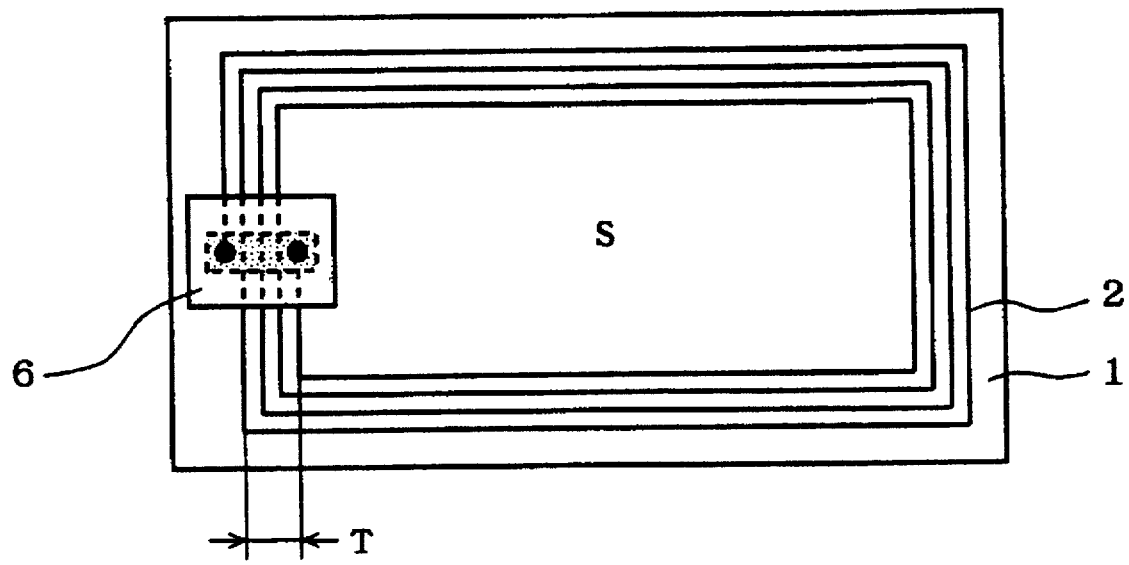
FIGS. 1A and 1B are a plan view and a partial cross section, respectively, of a basic embodiment of the circuit substrate used in the non-contact IC card of the present invention.
Figure 1B:
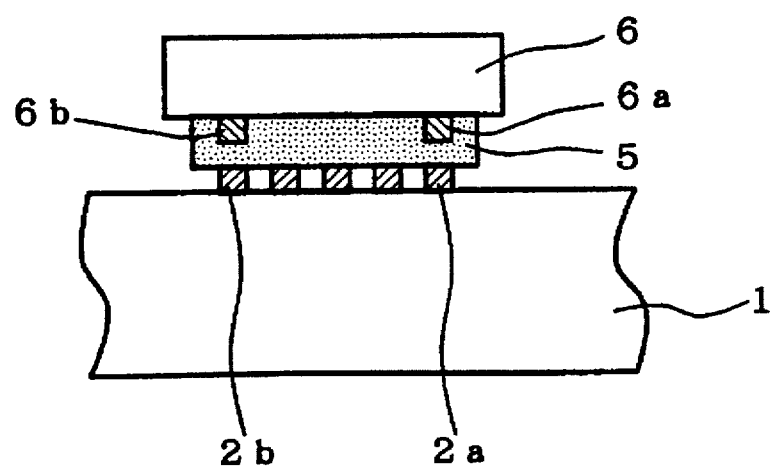
Figure 2A:
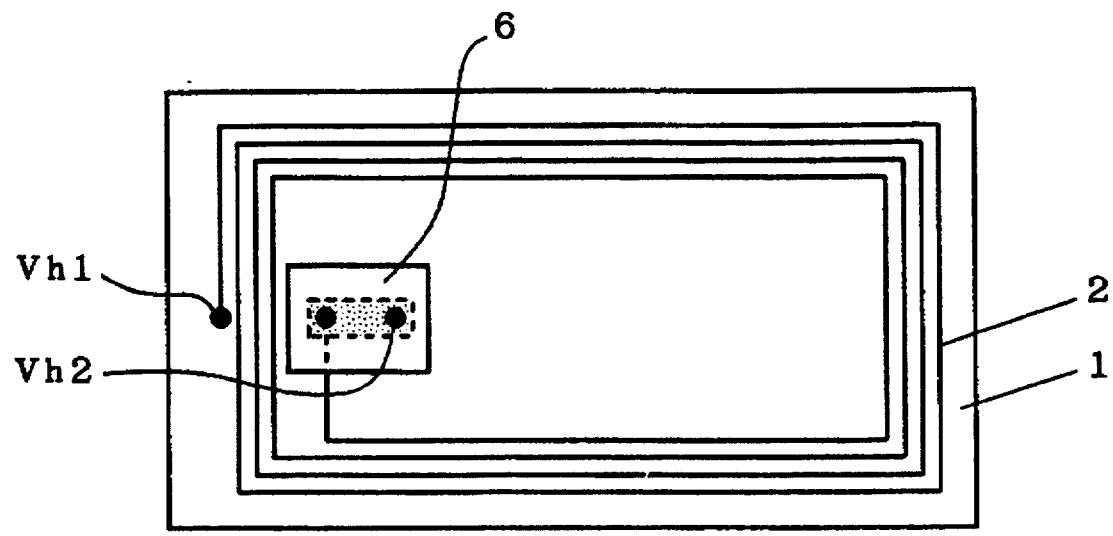
FIGS. 2A and 2B are a plan view and a partial cross section, respectively, of another embodiment of the circuit substrate used in the non-contact IC card of the present invention.
Figure 2B:
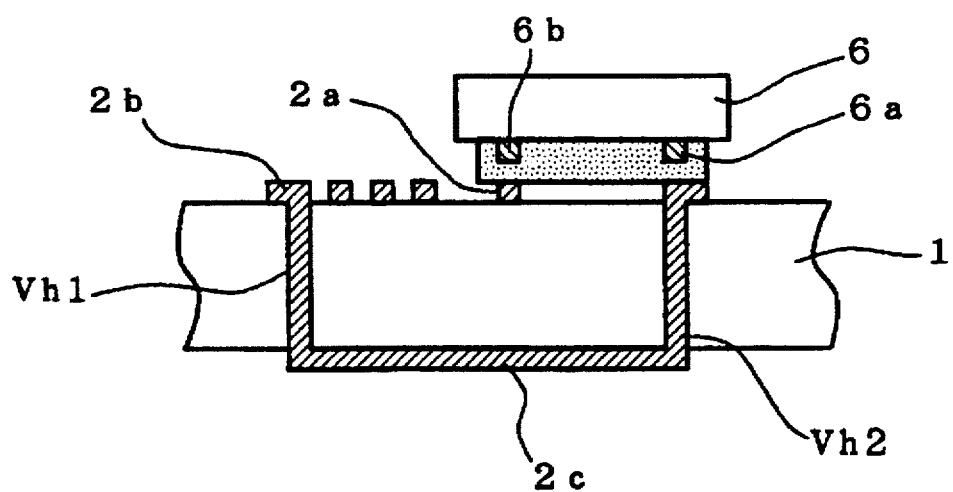

FIG. 1A is a plan view of a basic embodiment of the circuit substrate used in the non-contact IC card of the present invention, and FIG. 1B is a partial cross section of the circuit substrate at its part in the vicinity of the IC chip. This circuit substrate is comprised of an insulating substrate 1, an antenna coil 2 formed on the substrate by etching, and an IC chip 6 connected to them. An anisotropic conductive adhesive layer 5 is formed between the antenna coil 2 and the IC chip 6. It is impossible to use an isotropic conductive adhesive layer in place of the anisotropic conductive layer 5, because of shorting between adjacent antenna coil patterns. Via this anisotropic conductive adhesive layer 5, an inner peripheral side terminal 2a and an outer peripheral side terminal 2b are respectively connected to connecting bumps 6a and 6b of the IC chip. FIG. 2A is a plan view of another embodiment of the circuit substrate used in the non-contact IC card of the present invention, and FIG. 2B is a partial cross section thereof. In this embodiment of the circuit substrate, the outer peripheral side terminal 2b of the antenna coil formed on the insulating substrate 1 by etching is extended to turn on the side of the inner peripheral side terminal 2a of the insulating substrate through means of via holes Vh1 and Vh2 and a back conductive layer 2c.

The structure as shown in FIGS. 1A and 1B or FIGS. 2A and 2B makes it possible to interconnect the antenna coil 2 and the IC chip 6 in a face-down fashion without use of jumper wires. Hence, the IC chip can be produced without making the thickness of the IC card too large, and at a high connection reliability and a low production cost. Especially when, as shown in FIGS. 1A and 1B, the IC chip 6 is provided in the manner that it stands across the antenna coil in its width direction, the IC chip can be produced using a single-sided copper-clad substrate having a low material cost.

Incidentally, the number of turn of coils, opening area S (FIG. 1A) and coil width T (FIG. 1A) of the antenna coil 2 depends on the carrier wave transmitting-receiving characteristics of the non-contact IC card. Hence, in some cases, the distance between the inner peripheral side terminal 2a and the outer peripheral side terminal 2b is greater than the distance between the connecting bumps 6a and 6b of the IC chip 6. In such a case, as shown in FIG. 3, part of the antenna coil 2 may preferably be narrowed in its width direction so that the distance 2t between the inner peripheral side terminal 2a and outer peripheral side terminal 2b of the antenna coil 2 may be substantially the same as the distance 6t between the connecting bumps 6a and 6b of the IC chip 6.

Examples shown in FIGS. 1A, 1B, 2A, 2B and 3 are those comprising a tuning capacitor which constitutes a resonance circuit, and a voltage smoothing capacitor, which are provided within the area of the IC chip itself, are used as the IC chip. When the tuning capacitor 7 and the voltage smoothing capacitor 8 must be provided on the insulating substrate 1 separately from the IC chip 6, it is preferable to use those in which, as shown in FIG. 4A (a plan view) and FIG. 4B (a back view), these capacitors 7 and 8 are formed by etching as in the same case with the antenna coil. Such a structure can be formed by etching a double-sided copper-clad substrate so that the capacitors are formed.

Figure 4A:
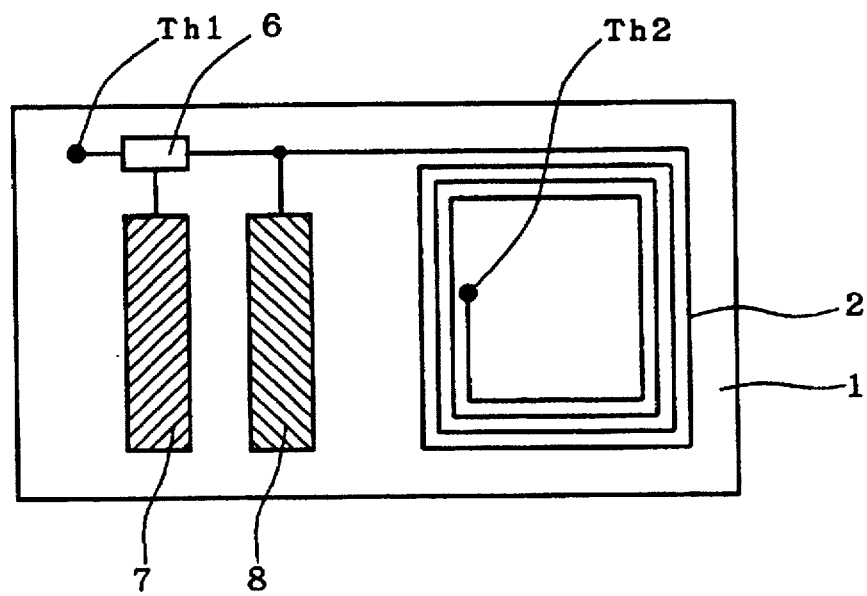
FIGS. 4A and 4B are a plan view and a back view, respectively, of still another embodiment of the circuit substrate used in the non-contact IC card of the present invention.
Figure 4B:
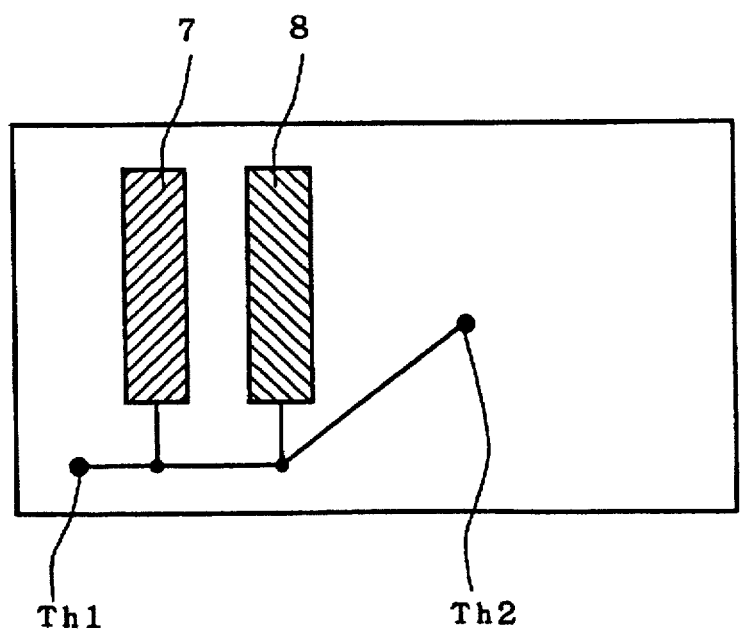

In the embodiment as shown in FIGS. 4A and 4B, the antenna coil 2 and the IC chip 6 may be connected to each other using through-holes Th1 and Th2, and also via the anisotropic conductive adhesive layer 5 (not shown).

Figure 3:
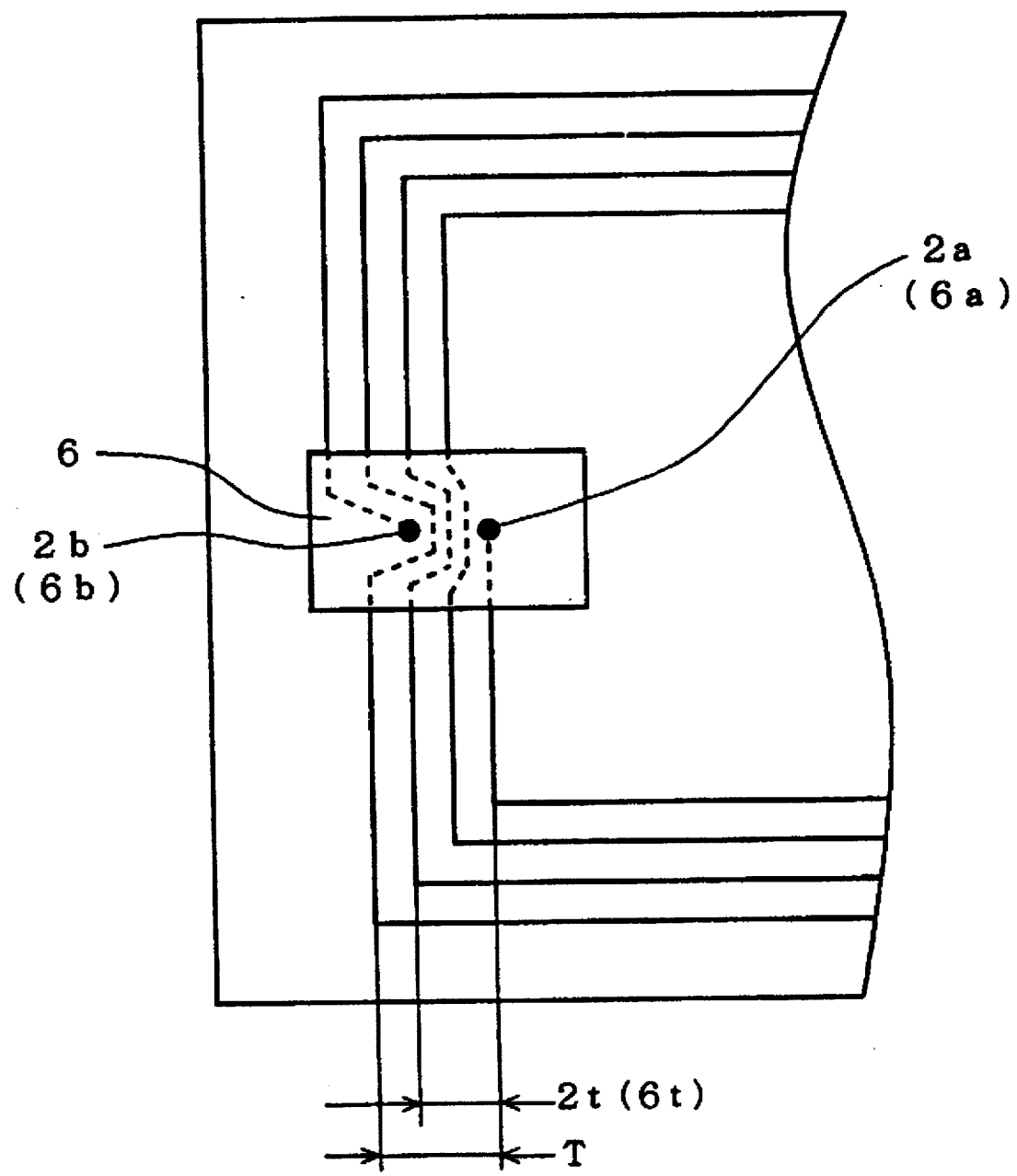
FIG. 3 is a partially enlarged view of still another embodiment of the circuit substrate used in the non-contact IC card of the present invention, the view being enlarged at the part in the vicinity of the IC chip.
Figure 5A:
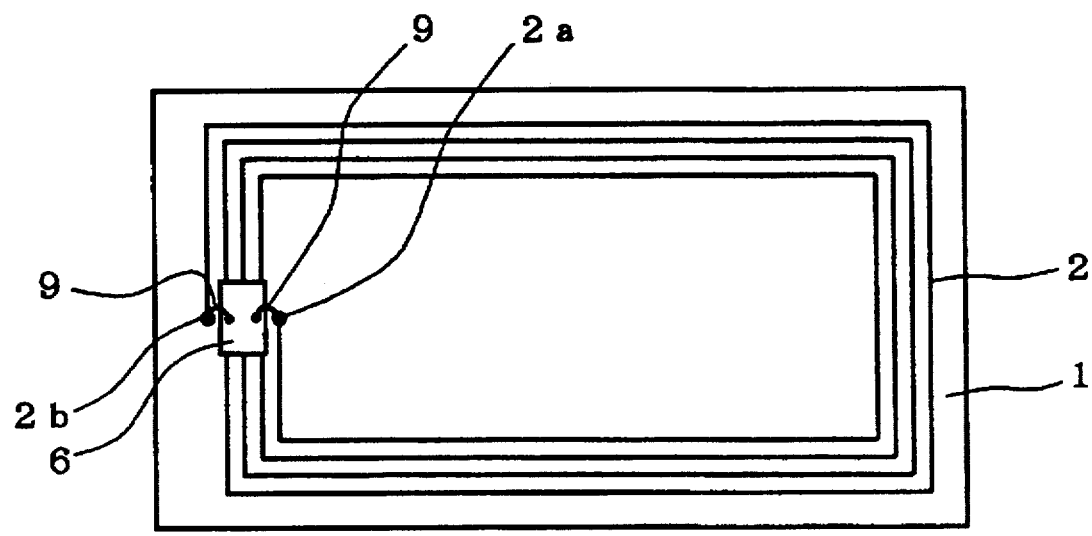
FIGS. 5A and 5B are a plan view and a partial cross section, respectively, of still another embodiment of the circuit substrate used in the non-contact IC card of the present invention.
Figure 5B:
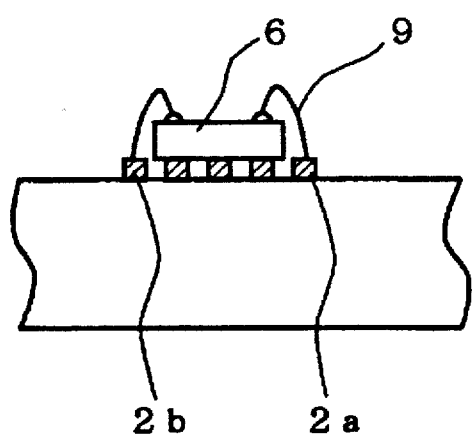

In the examples shown in FIGS. 1A, 1B, 2A, 2B, 3, 4A and 4B, the antenna coil 2 and the IC chip 6 are interconnected via the anisotropic conductive adhesive layer 5. As an alternative structure, as shown in FIGS. 5A and 5B, they may be interconnected through a bonding wire 9 by means of a wire bonding connector commonly used in the fabrication of semiconductor devices. Employment of such structure makes it unnecessary to use the jumper wires. In such a case, like the case as shown in FIGS. 1A and 1B, the IC chip 6 may preferably be provided in the manner that it stands across the antenna coil. Also, like the case as shown in FIG. 3, part of the antenna coil 2 may preferably be narrowed in its width direction so that the distance between the inner peripheral side terminal and outer peripheral side terminal of the antenna coil may be substantially the same as the distance between the two, connecting bumps of the IC chip. As the IC chip, those comprising the tuning capacitor which constitutes an resonance circuit, and the voltage smoothing capacitor, which are provided within the area of the IC chip itself, may also be used as the IC chip. When the tuning capacitor and the voltage smoothing capacitor must be provided on the insulating substrate 1 separately from the IC chip, it is preferable to use those in which, like the one as shown in FIGS. 4A and 4B, these capacitors are formed by etching as in the case of the antenna coil.

The non-contact IC card of the present invention can be made to have the structure wherein a core material comprising an urethane resin is provided on the surface of the substrate as described above on which the IC chip has been provided, and the substrate provided with these is further held between insulating films of polyethylene terephthalate or the like so as to be covered on its both sides.

The non-contact IC card of the present invention as shown in FIGS. 1A and 1B can be produced in the manner as shown in FIGS. 6A to 6E.

Figure 6A:
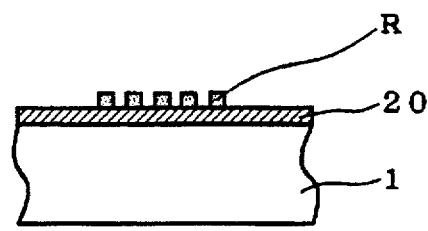
FIGS. 6A to 6E illustrate a process for producing the non-contact IC card of the present invention.

First, an insulating substrate 1 is prepared which is formed of polyester film, polyimide film or the like and on one side of which a conductive layer 20 formed of copper foil or the like has been stuck, and a resist layer R having at least an antenna coil pattern is formed on the conductive layer 20 (FIG. 6A). Such a resist layer R may preferably be formed using a known dry film resist, which enables easy formation of pinhole-free layers.

Figure 6B:
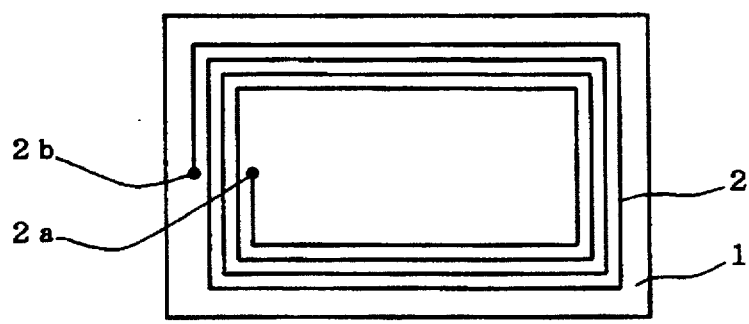

Next, using the resist layer R as a mask, the conductive layer 20 is etched with an etchant such as an aqueous ferric chloride solution. By this etching, the antenna coil 2 having at least the inner peripheral side terminal 2a and the outer peripheral side terminal 2b is formed on the insulating substrate 1 (FIG. 6B).

Figure 6C:
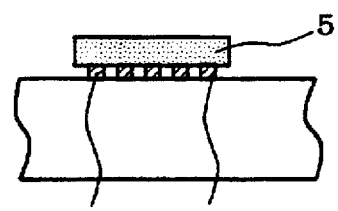

Next, on the terminals 2a and 2b of the antenna coil 2, an anisotropic conductive adhesive layer 5 of about 10 to 50 µm thick is formed by a conventional method while taking the bump height of the IC chip into account (FIG. 6C). In this instance, any known adhesive may be used as an anisotropic conductive adhesive, as exemplified by a thermoset plastic resin such as an epoxy resin, a phenol resin, a polyester resin and a (meth) acrylic resin. Taking account of adhesion of the antenna coil onto the fine pattern, it is preferable to use an adhesive having a viscosity (25° C.) of from 4,000 to 20,000 cPs, and preferably form 6,000 to 9,000 cPs.

The anisotropic conductive adhesive contains conductive particles which may preferably have particle diameters of usually from 2 to 8 µm, variable depending on the antenna coil pattern width and so forth. As the conductive particles, known material may be used, as exemplified by a metallic powder such as a Ni, Cu, Au or solder powder; a resin powder coated with a metallic layer such as a (meth)acrylic curing resin, epoxy curing resin or benzoguanamine curing resin powder coated with a Ni, solder, Au or Cu thin layer. The conductive particles may be contained in the anisotropic conductive adhesive usually in an amount of from 2 to 8% by weight.

In the embodiment as shown in FIGS. 6A to 6E, the anisotropic conductive adhesive layer 5 is formed on the antenna coil 2. Alternatively, it may be formed on the side of the connecting bumps 6a and 6b of the IC chip 6.

Figure 6D:
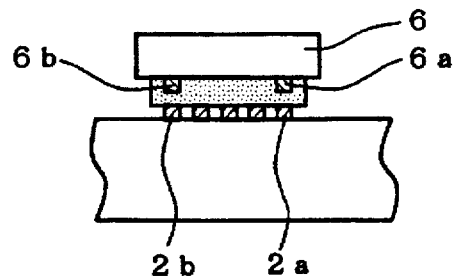
Figure 6E:
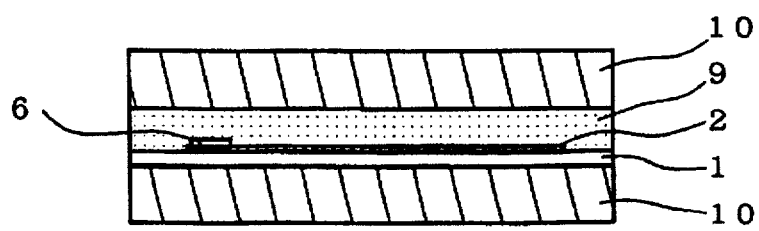
Figure 7:
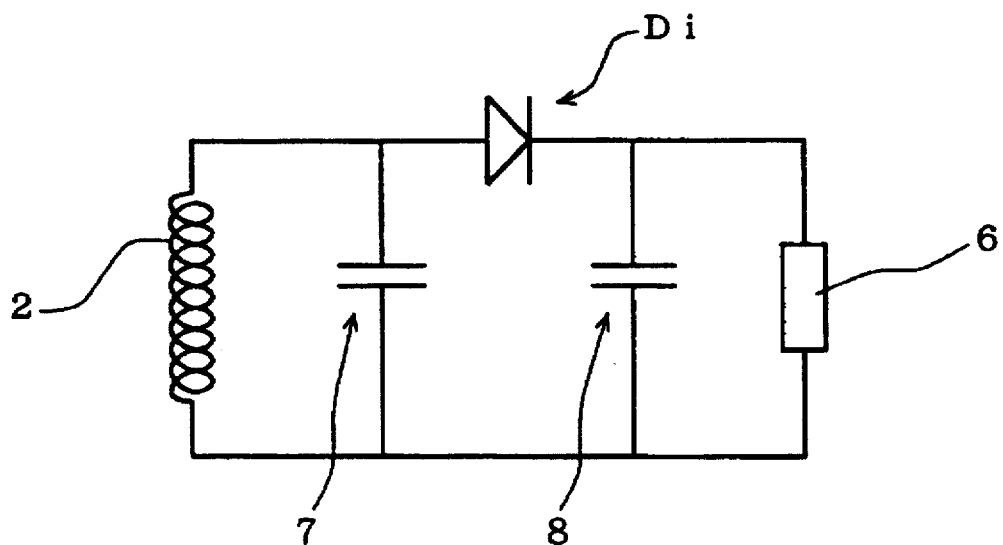
FIG. 7 illustrates a basic circuit construction of the non-contact IC card.
Figure 8:
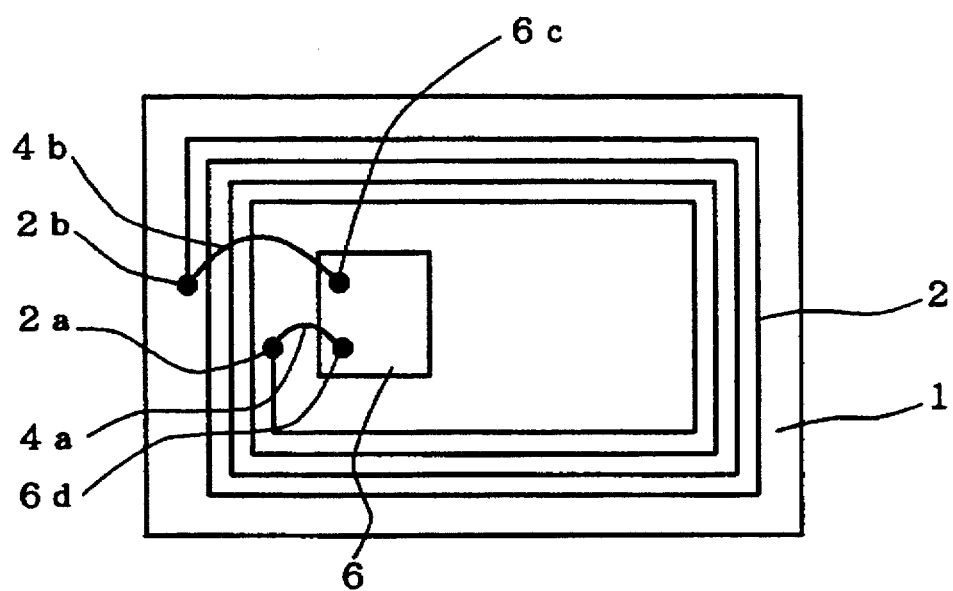
FIG. 8 illustrates how the IC chip and the antenna coil are interconnected in the conventional non-contact IC card.

Next, the connecting bumps 6a and 6b of the IC chip 6 are positionally adjusted to and then bonded to the terminals 2a and 2b of the antenna coil 2, optionally followed by heating or exposure to ultraviolet rays, to connect the former to the latter via the anisotropic conductive adhesive layer 5 (FIG. 6D). Thereafter, a core material 9 comprising urethane resin is provided on the side on which the IC chip 6 has been provided, and the substrate provided with these is further held between well scratch-resistant resin films 10 of polyethylene terephthalate or the like so as to be covered on its both sides. Thus, the non-contact IC card of the present invention can be obtained (FIG. 6E).

The non-contact IC card of the present invention according to the embodiment as shown in FIGS. 2A, 2B, 3, 4A and 4B can also be produced by the production process illustrated in FIGS. 6A to 6E and by known methods.

For example, the non-contact IC card according to the embodiment of FIG. 3 can be produced specifically in the following way.

First, an antenna coil 2 (22 turns) having a width T of 11 mm is formed on the copper foil of a single-sided copper clad substrate formed of 18 µm thick copper foil and 50 µm thick polyimide film. Here, the width of the antenna coil is partly decreased so as to provide a distance 2t of 4.5 mm between the inner peripheral side terminal 2a and the outer peripheral side terminal 2b.

Next, the anisotropic conductive adhesive is coated on the inner peripheral side terminal 2a and the outer peripheral side terminal 2b.

Next, using an IC chip 6 having connecting bumps 6a and 6b of 150 µm in bump diameter (distance 6t between bumps: 4.5 mm), the connecting bumps 6a and 6b are positionally adjusted so as to correspond to the terminals 2a and 2b of the antenna coil 2, and then bonded thereto by means of a contact bonding device to interconnect the both at a pressure of 11 kg/mm$^2$ and at a temperature of 170° C.

Next, a core material urethane resin is fed to the surface on the side of the IC chip 6, and the substrate provided with these is held between 18 µm thick polyester films so as to be covered on its both sides, followed by compression pressing at 70° C. and 3 kg/mm$^2$, and then cutting into the desired external shape. Thus, a non-contact IC card of 0.76 mm thick can be obtained.

As described above, according to the present invention, the IC chip and etched antenna coil of a non-contact IC card can be interconnected without making the thickness of the non-contact IC card too large, and yet at a high reliability and a low production cost.

What is claimed is:

1. A non-contact IC card that transfers information through an induction electromagnetic field serving as a transmission medium comprising:

a substrate having at least an IC chip and an antenna coil formed by etching; wherein a connecting terminal of said antenna coil and a connecting bump of said IC chip are interconnected in a face-down fashion via an anisotropic conductive adhesive layer;

the IC chip being formed across the antenna coil;

wherein at least part of said antenna coil is decreased in width so that a distance between the connecting terminal on an inner peripheral side and the connecting terminal on an outer peripheral side of said antenna coil is substantially the same as a distance between the connecting bumps of said IC chip which are connected with the terminals.

2. The non-contact IC card according to claim 1, wherein a tuning capacitor which constitutes an resonance circuit, and a voltage smoothing capacitor are provided within the area of the IC chip.

3. The non-contact IC card according to claim 1, wherein a tuning capacitor which constitutes an resonance circuit, and/or a voltage smoothing capacitor is/are provided on the substrate separately from said IC chip, and these capacitors are formed by etching.

4. A non-contact IC card that transfers information through an induction electromagnetic field serving as a transmission medium comprising:

a substrate having at least an IC chip and an antenna coil formed by etching, wherein a connecting terminal of said antenna coil and a connecting bump of said IC chip are directly interconnected by wire bonding, the IC chip being formed across the antenna coil, wherein at least part of said antenna coil is decreased in width so that a distance between the connecting terminal on an inner peripheral side and the connecting terminal on an outer peripheral side of said antenna coil is substantially the same as a distance between the connecting bumps of said IC chip which are connected with the terminals.

5. The non-contact IC card according to claim 4, wherein a tuning capacitor which constitutes an resonance circuit, and a voltage smoothing capacitor are provided within the area of the IC chip.

6. The non-contact IC card according to claim 4, wherein a tuning capacitor which constitutes an resonance circuit, and/or a voltage smoothing capacitor is/are provided on the substrate separately from said IC chip, and these capacitors are formed by etching.

7. A process for producing a non-contact IC card, comprising the steps of;

forming a resist layer having at least an antenna coil pattern, on a conductive layer provided on an insulating substrate;

etching the conductive layer, using the resist layer as a mask, to form at least an antenna coil and a connecting terminal thereof;

forming an anisotropic conductive adhesive layer on the connecting terminal of the antenna coil; and interconnecting the connecting terminal of the antenna coil and a connecting bump of an IC chip in a face-down fashion via the anisotropic conductive adhesive layer.

* * * * *